United States Patent [19]

Maniar

[11] Patent Number: 5,185,689

[45] Date of Patent: Feb. 9, 1993

[54] CAPACITOR HAVING A RUTHENATE ELECTRODE AND METHOD OF FORMATION

[75] Inventor: Papu D. Maniar, Austin, Tex.

[73] Assignee: Motorola Inc., Schaumburg, Ill.

[21] Appl. No.: 875,463

[22] Filed: Apr. 29, 1992

[51] Int. Cl.⁵ .......................... H01G 4/10; H01G 7/00
[52] U.S. Cl. ..................................... 361/313; 29/25.42
[58] Field of Search ............... 29/25.42; 361/304, 305, 361/321, 311, 312, 313; 428/338; 357/51

[56] References Cited

U.S. PATENT DOCUMENTS

| | | | |
|---|---|---|---|
| 4,925,538 | 5/1990 | Matsumoto et al. | 204/129.4 |
| 5,003,428 | 3/1991 | Shepherd | 361/321 |
| 5,005,102 | 4/1991 | Larson | 29/25.42 X |
| 5,122,923 | 6/1992 | Matsubara et al. | 361/321 |

Primary Examiner—Donald A. Griffin
Attorney, Agent, or Firm—Robert L. King

[57] ABSTRACT

A capacitor (11) is formed overlying a dielectric layer (34). A conductive layer (36) is formed overlying the dielectric layer (34). An optional barrier layer (16) is formed to electrically connect and isolate the conductive layer (36) from a first electrode region (20) which has a ruthenate portion. A dielectric layer (22) is formed overlying the first ruthenate electrode region (20) to form a capacitor dielectric. A second electrode region (24) is formed overlying the dielectric layer (22). An optional barrier layer (28) is formed overlying the electrode region (24). A conductive layer (32) is formed overlying the optional barrier layer (28) and makes electric contact to the electrode region (24). A dielectric layer (30) is formed to electrically isolate the capacitor (11).

29 Claims, 2 Drawing Sheets

CAPACITOR HAVING A RUTHENATE ELECTRODE AND METHOD OF FORMATION

FIELD OF THE INVENTION

The present invention relates generally to semiconductor technology, and more particularly, to ruthenate capacitor electrodes.

BACKGROUND OF THE INVENTION

For decades, capacitors have been an important and irreplaceable circuit element used often in electronic circuit designs. For example, capacitors are widely used in applications such as dynamic random access memory (DRAM), active and passive filters, analog-to-digital and digital-to-analog converters (A/D and D/A converters, respectively), operational amplifiers, radio and tuning circuits, oscillators and multivibrator circuits, time critical and time delay circuitry, noise reduction circuitry, charge pumps, power electronics, and many other diverse applications. A capacitor is defined in the simplist terms as a device consisting of two conducting surfaces separated by an insulating material. A capacitor stores electrical charge, blocks the flow of direct current (DC), and permits the flow of alternating current (AC) depending essentially upon the capacitance of the device and the frequency of the incoming current or charge. Capacitance, measured in farads, is determined by three physical characteristics: (1) a thickness or average thickness of the insulating material separating the two conducting surfaces; (2) how much surface area is covered by the two conducting surfaces; and (3) various mechanical and electrical properties of the insulating material and the two conducting surfaces or electrodes.

Many forms of capcitors exist in the semiconductor industry. In the early development and marketing of the above mentioned technologies, parallel plate or parallel electrode capacitors were used as capacitance structures. The parallel electrode capacitor is a capacitor that has a planar top and a planar bottom conducting surface separated by a planar dielectric or insulator. Another capacitor is known as a trench capacitor. The trench capacitor is formed by first etching a deep well, trench, or hole in a substrate surface or a surface overlying the substrate surface. This trench or hole is then used to form and contain two electrodes separated by an insulator. Other known structures such as double box capacitors, crown capacitors, fin capacitors, and the like have been developed.

In the early development of the semiconductor capacitor, a doped substrate formed a first capacitor electrode, silicon dioxide formed a capacitor dielectric, and a metal layer formed a second capacitor electrode. As technology progressed, polysilicon, epitaxial silicon, silicides, salicides, and several metallic conductors, such as osmium, rhodium, platinum, gold, ruthenium metal, and aluminum were developed for use as a capacitor electrode. In addition, improved capacitor dielectric materials were developed such as oxide-nitride-oxide (ONO), tantalum pentoxide ($Ta_2O_5$), and lead zirconium titanate (PZT) for use as capacitor dielectrics.

The current conventional and widely accepted electrode materials, such as the above mentioned polysilicon, epitaxial silicon, and several metallic conductors, such as aluminum, are not stable and oxidize in an oxygen ambient. In many cases, special care must be taken to ensure that an oxygen ambient is not exposed to the capacitor electrodes due to this oxidation phenomenon. Therefore, improved or complex processing equipment is required or additional cleaning and etch steps are required to maintain an oxide-free electrode surface. If an oxide-free surface is not achieved as is sometimes the case, electrode electrical contact quality, integrated circuit yield, and/or capacitor performance is reduced.

SUMMARY OF THE INVENTION

The previously mentioned disadvantages are overcome and other advantages achieved with the present invention. In one form, the present invention comprises a capacitor and a method of formation thereof. The capacitor has a first electrode. The first electrode has a portion formed of a ruthenate material. The capacitor has a second electrode, and a dielectric material is formed between the first electrode and the second electrode.

The present invention will be more clearly understood from the detailed description below in conjunction with the accompanying drawings.

DESCRIPTION OF THE PREFERRED EMBODIMENT

Figure 1:
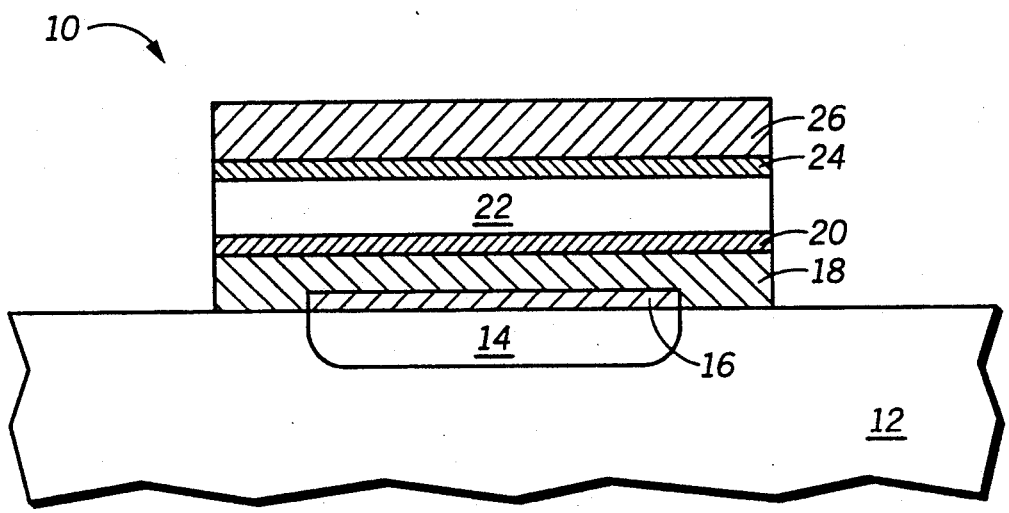
FIGS. 1-2 illustrate, in cross-sectional form, a method for forming a capacitor which has a ruthenate capacitor electrode in accordance with the present invention.

Illustrated in FIG. 1 is a structure suitable for formation of a capacitor 10. Capacitor 10 has a base layer or substrate 12 which has a surface and is of a first conductivity type. The conductivity type is one of either a P type conductivity or an N type conductivity if the substrate 12 is silicon-based. Substrate 12 may be made of silicon, gallium arsenide, silicon on sapphire (SOS), epitaxial formations, germanium, germanium silicon, polysilicon, and/or like substrate or conductive materials. Substrate 12 may include a conventional field oxide layer, diffusions, and the like conventional layers. Preferably, the substrate 12 is made of silicon.

A diffusion 14 is formed within the substrate 12. Diffusion 14 is referred to as an electrical contact conductive region in some cases. Diffusion 14 is of a second conductivity type which is opposite the first conductivity type. In some cases, diffusion 14 may be an active area or a source or a drain for a transistor (not illustrated). In the cases where the diffusion 14 is a transistor's current electrode, such as a source or a drain, either a dynamic random access memory (DRAM) cell or a non-volatile memory cell is formed depending on various dielectric materials of the capacitor. For example, if silicon dioxide is used for an inter-electrode capacitor dielectric, then a DRAM is formed. If, for example, lead zirconium titanate (PZT) is used as an inter-electrode capacitor dielectric, then a non-volatile memory is formed.

An optional barrier layer 16 is formed overlying the diffusion 14. Common barrier materials are titanium nitride, other nitrides, or silicides. The barrier layer 16 may be any material that performs the function of isolating the diffusion from overlying layers. The barrier layer 16 keeps the diffusion 14 from reacting to overlying areas. In addition, the barrier layer 16 may reduce diffusion and impurity transfer between the diffusion 14 and overlying layers. Other known phenomena, such as aluminum spiking in silicon, is avoided via barrier layer 16.

An electrode region 18 is formed overlying the barrier layer 16. The electrode region 18 is any conductive layer such as polysilicon, silicide, salicide, a metal, a refractory metal, a ruthenate material, or a like conductive layer. For certain applications, electrode region 18 may contain a dielectric region portion (not illustrated) which is used to isolate electrode region 18 from adjacent regions. In general, the dielectric layers described herein may be wet or dry silicon dioxide ($SiO_2$), nitride, tetraethylorthosilicate (TEOS) based oxides, borophospho-silicate-glass (BPSG), phospho-silicate-glass (PSG), boro-silicate-glass (BSG), oxide-nitride-oxide (ONO), tantalum pentoxide ($Ta_2O_5$), plasma enhanced silicon nitride ($P-SiN_x$), a spin on glass (SOG), and/or like dielectric materials unless otherwise noted.

An electrode region 20 is formed overlying the electrode region 18. Together electrode regions 18 and 20 form a first electrode for the capacitor 10. Electrode region 20 is either a ruthenate material or other known conductive materials. For example, electrode region 20 may be either calcium ruthenate, strontium ruthenate, barium ruthenate, thallium ruthenate, bismuth ruthenate, lead ruthenate, a combination of ruthenate materials, or like conductive materials. One of either electrode region 18 or electrode region 20 has a ruthenate material portion.

In another form, electrode region 18 is a ruthenate material and electrode region 20 is ruthenium oxide or an equivalent conductive oxide. This structure of electrode regions 18 and 20 will result for some methods of formation described herein. In some cases, electrode region 18 is ruthenium oxide or an equivalent oxide and electrode region 20 is ruthenate material. The formation of electrodes, such as the formation of the first electrode which is formed by electrode regions 18 and 20, is described in detail in subsequent paragraphs.

As illustrated in FIG. 1, a dielectric layer 22 is formed overlying the electrode region 20. Dielectric layer 22 may be a single dielectric material or a plurality of dielectric materials. Some dielectric materials which may be used for dielectric layer 22 are lead zirconium titanate (PZT), titanium silicate, barium titanate, calcium titanate, bismuth titanate, strontium titanate, silicon nitride, lead zirconate, lead lanthanum zirconium titanate, oxide-nitride-oxide (ONO), silicon dioxide ($SiO_2$), tantalum pentoxide ($Ta_2O_5$), titanium oxide, zirconium oxide, or lead titanate. Certain dielectrics can be used for dielectric layer 22 to make the capacitor either a non-volatile storage device or a capacitor having a conventional dielectric for use in a dynamic random access memory (DRAM).

A second capacitor electrode of capacitor 10 is formed via an electrode region 24 and an electrode region 26. The second electrode may be formed as a conventional electrode. The conventional electrode could be metal, polysilicon, or a like conductor. It should be apparent that electrode region 24 may be formed by a process and from materials that are identical to that discussed above for electrode region 20. Furthermore, electrode region 26 may be formed by a process and from materials that are identical to electrode region 18, which is discussed above. Therefore, electrode region 26 may be a ruthenate material or a like conductive layer, and electrode region 24 may either be a conductive layer or a dielectric material such as ruthenium oxide or the like. At least one electrode, either the first electrode or the second electrode, has a ruthenate portion.

Both of the first and second electrodes do not have to be made of the same materials. For example, one electrode may be a ruthenate-based electrode while the other electrode is an aluminum-based electrode. Furthermore, all of the scope, functionality, and compositions described for the first electrode applies to the second electrode and vice versa.

It should be well known that the structure illustrated in FIG. 1 may be formed either self-aligned or not self-aligned. A structure that is not self-aligned may vary in appearance from the capacitor 10 of FIG. 1. In a self-aligned capacitor, the first and second electrodes and the inter-electrode dielectric layer 22 of capacitor 10 are formed. An mask and etch step is used to horizontally align the first and second electrodes of capacitor 10 and the dielectric layer 22 as illustrated in FIG. 1. If no self-alignment is used, the dielectric layer 22 and the first and second electrodes of capacitor 10 are each formed by separate mask and etch sequences. Furthermore, self-alignment may be performed on predetermined elements of capacitor 10 and not on other elements of capacitor 10.

Figure 2:
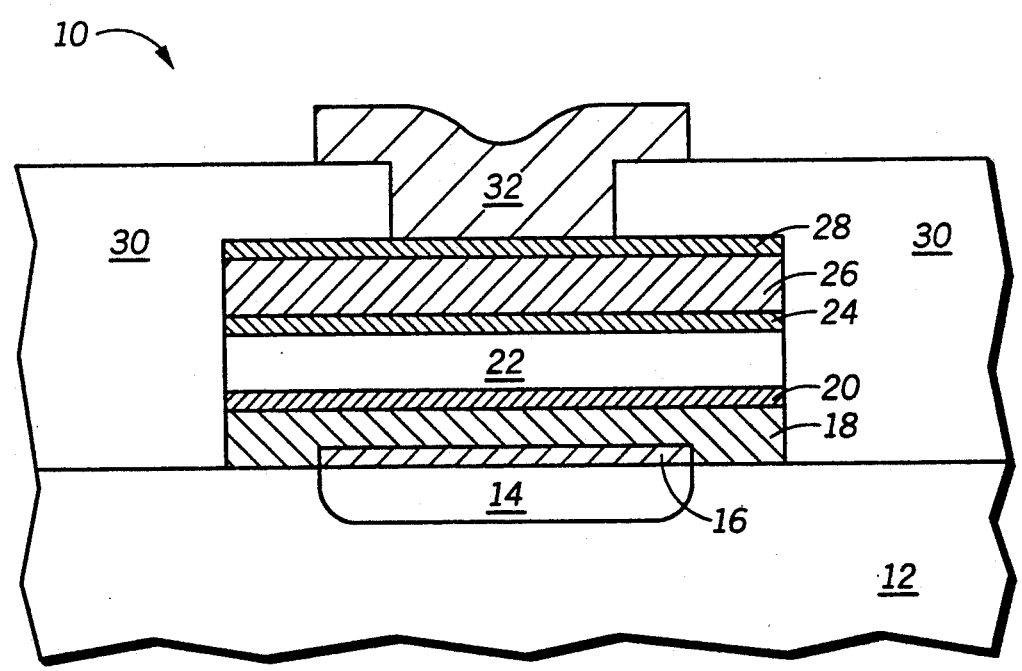

In FIG. 2, a barrier layer 28 is formed overlying the electrode region 26. The barrier layer 28 functions in a manner similar to barrier layer 16 and is made of a similar material or similar materials.

In FIG. 2, a dielectric layer 30 is formed overlying and adjacent the electrode regions 18, 20, 24, and 26, dielectric layer 22 and barrier layer 28. Dielectric layer 30 is preferably BPSG, PSG, a silicon-based oxide, polyimides, or an orghanic dielectric, and is used to isolate the first and second electrodes of capacitor 10 from adjacent structures (not illustrated). An electrical contact conductive layer 32 connects to the second capacitor electrode at the barrier layer 28 and provides for external electrical connection of the second capacitor electrode. The diffusion 14 electrically connects to the barrier layer 16 and allows the first capacitor electrode to be externally connected or electrically routed. In another form, both the first and second electrodes are connected via an overlying conductive layer (not illustrated) to form external electrical connections.

Figure 3:
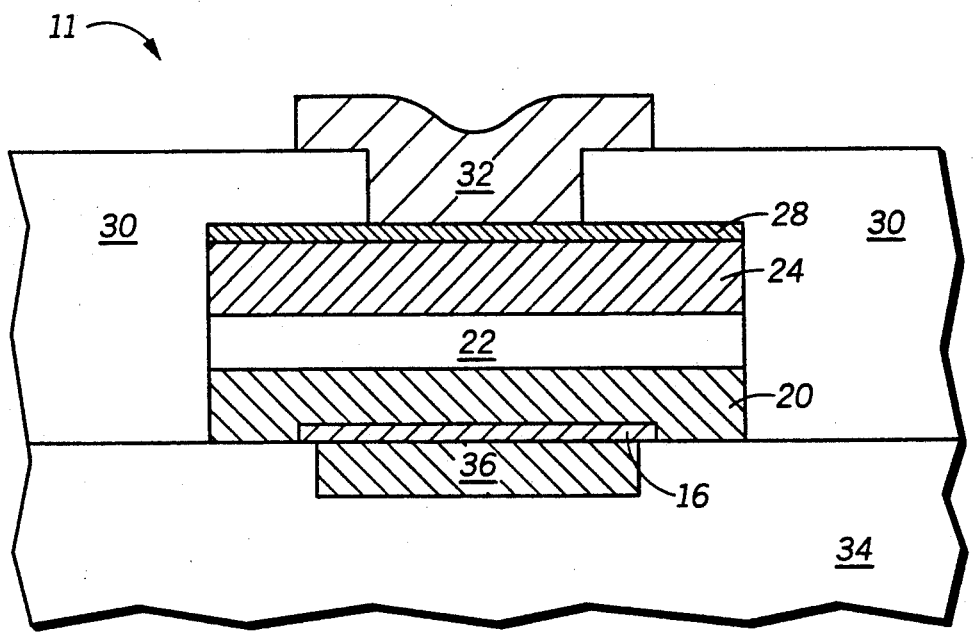
FIG. 3 illustrates, in cross-sectional form, an alternative capacitor which has a ruthenate capacitor electrode in accordance with the present invention.

FIG. 3 illustrates an alternative device referred to as a capacitor 11. Several elements in FIG. 3 are identical to elements in FIG. 2 and are therefore identically labeled. The scope, composition, and functionality of these identical elements are the same as in capacitor 10 of FIG. 2. A dielectric layer 34 is illustrated in FIG. 3. A plurality of device layers may underlie the dielectric layer 34. Device layers are substrate materials, polysilicon layers, oxide layers, diffusions, metal layers, and other semiconductor-compatible layers. For example, dielectric layer 34 could insulate underlying transistors (not illustrated), could be an inter-polysilicon dielectric, could be a inter-metal dielectric, or could overlie a device structure (not illustrated). In general, FIG. 3 illustrates that the capacitor 10 of FIG. 2 may be formed overlying a substrate (not illustrated in FIG. 3).

A conductive layer 36 is formed overlying or within the dielectric layer 34. Conductive layer 36 is made of one of either polysilicon, metal or a like conductive layer. Barrier layer 16 is formed. Electrode region 20 is formed overlying the barrier region. Electrode region 20 is made of a ruthenate material or a conventional conductive material. For example, electrode region 20 may be either calcium ruthenate, strontium ruthenate, barium ruthenate, thallium ruthenate, bismuth ruthenate, lead ruthenate, or other conventional conductors discussed herein. Electrode region 20 forms a first electrode for capacitor 11.

A dielectric layer 22 is formed overlying the electrode region 20. Some dielectric materials which may be used for dielectric layer 22 are lead zirconium titanate (PZT), tantalum pentoxide, silicon dioxide, titanium silicate, barium titanate, calcium titanate, bismuth titanate, strontium titanate, silicon nitride, lead zirconate, lead lanthanum zirconium titanate, oxide-nitride-oxide (ONO), lead titanate, or other dielectrics as discussed herein for FIGS. 1-2.

A second electrode of capacitor 11 is formed via electrode region 24. Electrode region 24 may be a conventional conductive electrode region as described herein or a ruthenate electrode region similar to the electrode region 20. One of either the first electrode or the second electrode of capacitor 11 is formed as a ruthenate material.

Barrier layer 28, dielectric layer 30 and conductive layer 32 are formed in FIG. 3 as discussed herein in reference to FIG. 2.

Capacitor 11 of FIG. 3 differs from capacitor 10 of FIG. 2 in two primary ways. One difference being that the capacitor 11 is formed overlying the substrate and possibly overlying other devices (not illustrated). This technique of device stacking is known to improve DRAM cell density. A second difference is that capacitor 11, in a preferred form, has first and second capacitor electrodes that are entirely made of one material. In a preferred form, at least one electrode is entirely made of a ruthenate material.

It is important to note that several electrode materials and several capacitor dielectric materials are discussed herein. The capacitor dielectric materials and the composition of the electrodes may vary as long as a portion of one of either the first or second electrodes is made of a ruthenate material.

It is important to focus on the ruthenate electrodes and discuss how a ruthenate material is formed for a capacitor electrode. One method used to form a ruthenate electrode is to directly sputter a ruthenate material onto a device, and etch the sputtered ruthenate material to form an electrode or a plurality of electrodes.

Figure 4:
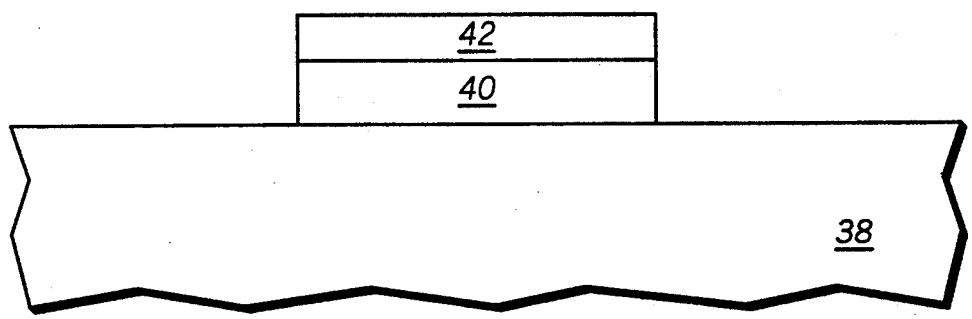
FIGS. 4-5 illustrate, in cross-sectional form, a method for forming a ruthenate capacitor electrode in accordance with the present invention.

Another method that may be used to form a ruthenate electrode is illustrated in FIG. 4. A layer 38 is formed or provided. Layer 38 is analogous to one of either substrate 12 of FIG. 1, dielectric layer 22 of FIGS. 1-3, dielectric layer 34 of FIG. 3, or any layer which would allow for an overlying electrode formation. A layer 40 is formed. Layer 40 is formed as a ruthenium oxide layer ($RuO_2$). A layer 42 is formed overlying or adjacent the layer 40 and contacts layer 40 at an interface. Layer 42 is a metallic oxide, such as barium oxide, bismuth oxide, strontium oxide, lead oxide, calcium oxide, thallium oxide, lead zirconium titanate or a like metal-containing material.

Figure 5:
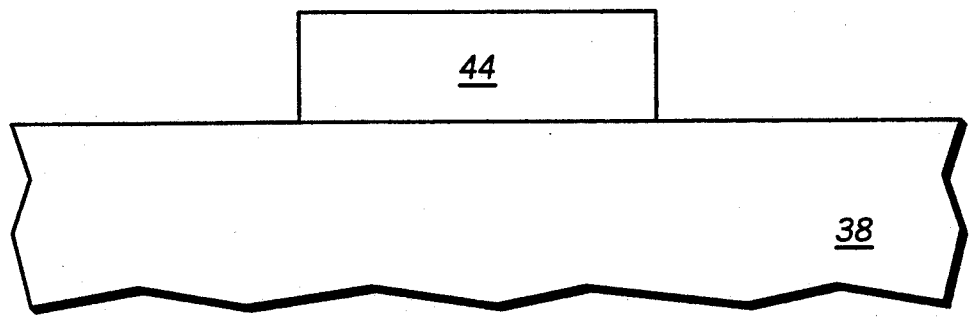

In FIG. 5, the layers 40 and 42 are heated and a ruthenate layer, referred to as a layer 44, is formed at the interface between layer 40 and layer 42. The reaction that forms the ruthenate layer 44 will either consume both layers 40 and 42 or leave either a portion of layer 40 or a portion of layer 42 remaining (not illustrated). In some cases, the ruthenium oxide layer is not formed thick enough to remain after the reaction.

Chemical vapor deposition (CVD) or other known forms of deposition may be used to form the layers 40 and 42. In addition, a metallic or metallic oxide spin on glass (SOG) may be used to form a metallic oxide layer as one of either layer 40 or layer 42. In another form, a metallic oxide and a ruthenium oxide are simultaneously deposited in a single step to form layer 44 of FIG. 5. The chemicals to form the ruthenium oxide and the chemicals used to form the metallic oxide are pumped into one semiconductor equipment chamber and reacted and/or deposited simultaneously. The simultaneous deposition will form a ruthenate layer as layer 44 at elevated temperatures or in proper processing environments.

It should be noted that a metallic oxide layer may be formed as the layer 40 with a ruthenium oxide layer being formed as the layer 42. Heat will cause the two layers 40 and 42 to react in a manner similar to that discussed above. In most cases, the metallic oxide layer is placed either overlying or underlying the ruthenium oxide layer depending on the application. For example, the ruthenium oxide layer is usually placed over the metallic oxide layer to form a lower first electrode whereas the order is reversed to form an upper second electrode.

In another form, a ruthenium metal layer may be sputtered, deposited or formed in a like conventional manner as either layer 40 or layer 42 of FIG. 4. The remaining layer, either layer 40 or layer 42, is formed as a metal or metallic oxide layer as described herein. Layers 40 and 42 share a common interface. The ruthenium layer and the metallic oxide layer are then heated in an oxygen-containing or oxidizing ambient in FIG. 5 to form a ruthenate layer of material at the common interface. Some metals that may be used with this method are barium, strontium, bismuth, lead, calcium, or thallium.

Aluminum and polysilicon are popular materials that are used for electrode formation. These materials are not stable in an oxygen ambient and therefore form oxidized surfaces when exposed to ambient air or when processed through certain processing steps. A ruthenate material remains conductive in an oxygen-containing ambient and can therefore endure cleaning cycles, deionized (DI) water rinses, ambient exposure, and subsequent processing without the disadvantage of oxidation. Therefore, improved electrical contact can be made to capacitor electrodes without the need for extra processing, oxide etch steps, or special wafer isolation from oxygen. The elimination of native oxide on electrodes will improve the performance of capacitors.

While the present invention has been illustrated and described with reference to specific embodiments, further modifications and improvements will occur to those skilled in the art. For example, the ruthenate electrode formation discussed herein can be formed into any geometry. Trench capacitors, double box capacitors, fin capacitors, parallel plate capacitors, crown capacitors, nested capacitors, and other known capacitive structures can be formed with ruthenate electrodes. A DRAM memory cell or a non-volatile memory cell may be formed with the inventive ruthenate electrodes taught herein. Due to the fact that the ruthenate material is usually formed from other materials or is formed adjacent other conductors, the ruthenate material will in some cases form only a portion of a capacitor electrode. For example, aluminum or polysilicon may be insulated by a conductive ruthenate to inhibit electrode oxidation. It should also be noted that ruthenate materials other than the ruthenates mentioned herein may be capable of forming capacitor electrodes. In addition, several ruthenates may be used to form single electrode. For example, an electrode may be formed with a first portion which is made of calcium ruthenate and a second portion which is made of lead ruthenate. In addition, several known dielectrics may be used to form inter-electrode capacitor dielectrics. Any dielectric may be formed with an electrode made of ruthenate even though the interface may require a glue layer or a barrier layer for adhesion or protection. The barrier layers mentioned herein are optional and may not be needed for all processes and applications. It is to be understood, therefore, that this invention is not limited to the particular forms illustrated and that it is intended in the appended claims to cover all modifications that do not depart from the spirit and scope of this invention.

I claim:

1. A capacitor comprising:
   a first electrode having a first portion formed of a material selected from a group consisting of: calcium ruthenate, strontium ruthenate, barium ruthenate, thallium ruthenate, bismuth ruthenate, and lead ruthenate;
   a second electrode; and
   a dielectric material formed between the first electrode and the second electrode.

2. The capacitor of claim 1 wherein the dielectric material is selected from a group consisting of: lead zirconium titanate, tantalum pentoxide, silicon dioxide, oxide-nitride-oxide (ONO), titanium silicate, barium titanate, calcium titanate, bismuth titanate, strontium titanate, silicon nitride, lead zirconate, lead lanthanum zirconium titanate, titanium oxide, zirconium oxide, and lead titanate.

3. The capacitor of claim 1 wherein the first electrode further comprises:
   a second portion of the second electrode formed of ruthenium oxide wherein either the first portion of the first electrode is formed between the second portion of the first electrode and the dielectric material or the second portion of the first electrode is formed between the first portion of the first electrode and the dielectric material.

4. The capacitor of claim 1 wherein the second electrode is formed having a first portion which is a ruthenate material.

5. The capacitor of claim 4 wherein the second electrode further comprises:
   a second portion of the first electrode formed of ruthenium oxide wherein either the first portion of the second electrode is formed between the second portion of the second electrode and the dielectric material or the second portion of the second electrode is formed between the first portion of the second electrode and the dielectric material.

6. The capacitor of claim 1 wherein the capacitor is connected to a current electrode of a transistor to form one of either a dynamic random access memory cell or a non-volatile memory cell.

7. The capacitor of claim 1 further comprising:
   an electrical contact conductive region; and
   a barrier layer formed adjacent a predetermined one of either the first electrode or the second electrode, the barrier layer electrically contacting the predetermined one of either the first electrode or the second electrode to the electrical contact conductive region.

8. A method for forming a capacitor comprising the steps of:
   forming a first electrode having a first portion made of a material selected from a group consisting of: calcium ruthenate, strontium ruthenate, barium ruthenate, thallium ruthenate, bismuth ruthenate, and lead ruthenate;
   forming a second electrode; and
   forming a dielectric material between the first electrode and the second electrode.

9. The method of claim 8 wherein the step of forming the first electrode further comprises:
   sputtering the ruthenate material to form a portion of the first electrode.

10. The method of claim 8 wherein the step of forming the first electrode further comprises:
    depositing a ruthenium oxide layer;
    depositing a metallic oxide adjacent the ruthenate oxide layer, the ruthenium oxide layer contacting the metallic oxide layer at an interface; and
    heating the ruthenium oxide layer and the metallic oxide layer to form said ruthenate material at the interface of the ruthenium oxide layer and the metallic oxide layer.

11. The method of claim 10 wherein the metallic oxide layer is a material selected from a group consisting of: strontium oxide, calcium oxide, barium oxide, thallium oxide, bismuth oxide, lead oxide, and lead zirconium titanate.

12. The method of claim 9 wherein the step of forming the first electrode further comprises:
    using a metallic oxide spin on glass to create a metallic oxide layer;
    forming a ruthenium oxide layer adjacent the metallic oxide layer, the ruthenium oxide layer contacting the metallic oxide layer at an interface; and
    heating the ruthenium oxide layer and the metallic oxide layer to form said ruthenate material at the interface of the ruthenium oxide layer and the metallic oxide layer.

13. The method of claim 12 wherein the metallic oxide layer is a material selected from a group consisting of: strontium oxide, calcium oxide, barium oxide, thallium oxide, bismuth oxide, lead oxide, and lead zirconium titanate.

14. The method of claim 8 wherein the step of forming the first electrode further comprises:
    depositing simultaneously a metallic oxide layer and a ruthenium oxide layer to form said ruthenate material.

15. The method of claim 8 wherein the dielectric material is formed by a material selected from a group consisting of: lead zirconium titanate, tantalum pentoxide, silicon dioxide, oxide-nitride-oxide (ONO), titanium silicate, barium titanate, calcium titanate, bismuth titanate, strontium titanate, silicon nitride, lead zirconate, lead lanthanum zirconium titanate, titanium oxide, zirconium oxide, and lead titanate.

16. The method of claim 8 wherein the step of forming the first electrode further comprises:
    forming a second portion of the first electrode of ruthenium oxide wherein either the first portion of the first electrode is formed between the second portion of the first electrode and the dielectric material or the second portion of the first electrode is formed between the first portion of the first electrode and the dielectric material.

17. The method of claim 8 wherein the second electrode is formed having a first portion which is a ruthenate material.

18. The method of claim 17 wherein the step of forming the second electrode further comprises:
   forming a second portion of the second electrode of ruthenium oxide wherein either the first portion of the second electrode is formed between the second portion of the second electrode and the dielectric material or the second portion of the second electrode is formed between the first portion of the second electrode and the dielectric material.

19. The method of claim 8 wherein the step of forming the first electrode further comprises:
   forming a ruthenium metal layer;
   forming one of either a metallic layer or a metallic oxide layer adjacent the ruthenium metal layer, the one of either a metallic layer or a metallic oxide layer contacting the ruthenium metal layer at an interface; and
   heating the ruthenium metal layer and the one of either a metallic layer or a metallic oxide layer in an oxidizing ambient to form said ruthenate material at the interface of the ruthenium metal layer and the one of either a metallic layer or a metallic oxide layer.

20. The method of claim 8 further comprising the steps of:
   forming an electrical contact conductive region; and
   forming a barrier layer adjacent a predetermined one of either the first electrode or the second electrode, the barrier layer electrically contacting the predetermined one of either the first electrode or the second electrode to the electrical contact conductive region.

21. A capacitor comprising:
   a first electrode having a portion formed of a ruthenate material selected from a group consisting of: calcium ruthenate, strontium ruthenate, barium ruthenate, thallium ruthenate, bismuth ruthenate, and lead ruthenate;
   a second electrode; and
   a dielectric material formed between the first electrode and the second electrode and being made of a material selected from a group consisting of: lead zirconium titanate, titanium silicate, barium titanate, calcium titanate, bismuth titanate, strontium titanate, silicon nitride, lead zirconate, lead lanthanum zirconium titanate, oxide-nitride-oxide (ONO), silicon dioxide, tantalum pentoxide, titanium oxide, zirconium oxide, and lead titanate.

22. The capacitor of claim 21 wherein a portion of the second electrode is formed of a ruthenate material selected from a group consisting of: calcium ruthenate, strontium ruthenate, barium ruthenate, thallium ruthenate, bismuth ruthenate, and lead ruthenate.

23. A capacitor comprising:
   a first electrode having a first portion formed of a ruthenate material which is resistive to oxidation in an oxygen-containing ambient;
   a second electrode; and
   a dielectric material formed between the first electrode and the second electrode.

24. The capacitor of claim 23 wherein the first electrode is formed as a material selected from a group consisting of: calcium ruthenate, strontium ruthenate, barium ruthenate, thallium ruthenate, bismuth ruthenate, and lead ruthenate.

25. The capacitor of claim 23 wherein the dielectric material is selected from a group consisting of: lead zirconium titanate, tantalum pentoxide, silicon dioxide, oxide-nitride-oxide (ONO), titanium silicate, barium titanate, calcium titanate, bismuth titanate, strontium titanate, silicon nitride, lead zirconate, lead lanthanum zirconium titanate, titanium oxide, zirconium oxide, and lead titanate.

26. The capacitor of claim 23 wherein the capacitor is connected to a current electrode of a transistor to form one of either a dynamic random access memory cell or a non-volatile memory cell.

27. A method for forming a capacitor comprising the steps of:
   forming a first electrode having a first portion made of a ruthenate material which is resistive to oxidation in an oxygen-containing ambient;
   forming a second electrode; and
   forming a dielectric material between the first electrode and the second electrode.

28. The method of claim 27 wherein the first portion of the first electrode is formed as a material selected from a group consisting of: calcium ruthenate, strontium ruthenate, barium ruthenate, thallium ruthenate, bismuth ruthenate, and lead ruthenate.

29. The method of claim 27 wherein the dielectric material is formed by a material selected from a group consisting of: lead zirconium titanate, tantalum pentoxide, silicon dioxide, oxide-nitride-oxide (ONO), titanium silicate, barium titanate, calcium titanate, bismuth titanate, strontium titanate, silicon nitride, lead zirconate, lead lanthanum zirconium titanate, titanium oxide, zirconium oxide, and lead titanate.

* * * * *